(12) United States Patent
Feng

(10) Patent No.: US 10,720,475 B2
(45) Date of Patent: Jul. 21, 2020

(54) OLED DISPLAY DEVICE WITH EMBEDDED TOUCH ELECTRODE

(71) Applicant: Wuhan China Star Optoelectronics Semiconductor Display Technology Co., Ltd., Wuhan, Hubei (CN)

(72) Inventor: Xiaoliang Feng, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 162 days.

(21) Appl. No.: 15/754,584

(22) PCT Filed: Jan. 19, 2018

(86) PCT No.: PCT/CN2018/073347
§ 371 (c)(1),
(2) Date: Feb. 22, 2018

(87) PCT Pub. No.: WO2019/119596
PCT Pub. Date: Jun. 27, 2019

(65) Prior Publication Data
US 2019/0386069 A1 Dec. 19, 2019

(30) Foreign Application Priority Data
Dec. 18, 2017 (CN) .......................... 2017 1 1366293

(51) Int. Cl.
*H01L 27/32* (2006.01)
*G06F 3/041* (2006.01)
(Continued)

(52) U.S. Cl.
CPC .......... *H01L 27/323* (2013.01); *G06F 3/0412* (2013.01); *H01L 51/5206* (2013.01); *H01L 51/5221* (2013.01); *H01L 51/56* (2013.01)

(58) Field of Classification Search
CPC ............... H01L 27/3225; H01L 27/323; H01L 27/3244; H01L 27/3246; H01L 27/3248
See application file for complete search history.

(56) References Cited

FOREIGN PATENT DOCUMENTS

CN 103984442 A 8/2014
CN 106206666 A 12/2016
(Continued)

*Primary Examiner* — Hoai V Pham
(74) *Attorney, Agent, or Firm* — Hemisphere Law, PLLC; Zhigang Ma

(57) ABSTRACT

A touch display device includes substrate; TFT layer positioned on substrate, and the TFT layer comprising TFT; anode positioned on TFT layer and contacting with source or drain of the TFT; first touch electrode structure positioned on TFT and insulating with the anode; first planar layer positioned on first touch electrode structure, TFT and anode, the first planar layer has a first hole for exposing the anode; second touch electrode structure positioned on first planar layer; OLED element positioned on anode; cathode positioned on first planar layer and insulating with second touch electrode structure, cathode is filled first hole for connecting with the OLED element; and packaging layer positioned on cathode and first planar layer. The invention is embedded the touch electrode structure in the OLED display device, achieves highly touch accuracy and sensitivity In-cell touch OLED display device.

5 Claims, 7 Drawing Sheets

(51) Int. Cl.
 *H01L 51/52* (2006.01)
 *H01L 51/56* (2006.01)

(56) References Cited

FOREIGN PATENT DOCUMENTS

| | | |
|---|---|---|
| CN | 107104131 A | 8/2017 |
| CN | 107272958 A | 10/2017 |
| CN | 107526468 A | 12/2017 |
| KR | 10-2014-0039470 A | 4/2014 |

# OLED DISPLAY DEVICE WITH EMBEDDED TOUCH ELECTRODE

RELATED APPLICATIONS

The present application is a National Phase of International Application Number PCT/CN2018/073347, filed Jan. 19, 2018, and claims the priority of China Application No. 201711366293.5, filed Dec. 18, 2017.

FIELD OF THE DISCLOSURE

The disclosure relates to a touch display technical field, and more particularly to a touch display device and manufacturing method thereof.

BACKGROUND

With fast development of the display technology, people have more and more standard for display device, and property of high resolution, high colorful, fast response also cause the development of the display technology toward to high, strong, fast and thin. Semiconductor element technology is also fast development as a display problem solving solution of Organic Light Emitting Diode (OLED). In the existing technology, OLED display has self-luminous, fast response, wide view angle, suitable flexible substrate, such that could apply to cell phone, television, computer and some regulatory electric device, it also could used for virtual reality (VR) device, watch, wearable device, even though could used for bendable, flexible display filed. OLED display is widely used so that became one of the feature mainstream display technologies. Hence, the development and the research of the OLED is became core of feature display market for big panel manufacturing company.

Currently, with development of the technology, touch technology is more and more following with display technology, and become a necessary affiliated function of the display device. With more and more accuracy of the display, requirement of the touch technology is also gradually increased; the accuracy and sensitivity of the touch became an important factor of the display experience.

SUMMARY

A technical problem to be solved by the disclosure is to provide a touch display device and manufacturing method thereof. It is embedded the touch technology in the OLED display device for achieves to high touch accuracy and sensitivity.

An objective of the disclosure is achieved by following embodiments. In particular, a touch display device includes a substrate; a TFT layer positioned on the substrate, and the TFT layer comprising a TFT; an anode positioned on the TFT layer and contacting with a source or a drain of the TFT; a first touch electrode structure positioned on the TFT and insulating with the anode; a first planar layer positioned on the first touch electrode structure, the TFT and the anode, the first planar layer has a first hole for exposing the anode; a second touch electrode structure positioned on the first planar layer; an OLED element positioned on the anode; a cathode positioned on the first planar layer and insulating with the second touch electrode structure, the cathode is filled the first hole for connecting with the OLED element; and a packaging layer positioned on the cathode and the first planar layer.

In an embodiment, the touch display device further comprises an insulating protecting layer positioned between the first planar layer and the cathode, and covering the second touch electrode structure.

In an embodiment, the first touch electrode structure comprising a plurality of first sensing strip, the first sensing strips are parallel to each other and separately positioned, and each of the first sensing strips is extending along a first direction, each of the first sensing strips comprises a plurality of cascade first sensing pad and a plurality of first bridge connector.

In an embodiment, the second touch electrode structure comprising a plurality of second sensing strip, the second sensing strips are parallel to each other and separately positioned, and each of the second sensing strips is extending along a second direction which is perpendicular to the first direction, each of the second sensing strips comprises a plurality of cascade second sensing pad and a plurality of second bridge connector.

In an embodiment, shape of the first sensing pad and/or the second sensing pad is one of rectangular, grid, rhombus, triangle, regular pentagon, regular hexagon, regular.

In an embodiment, the touch display device further comprising a plurality of binding pad and a plurality of wire, each of the first sensing strips correspondingly connecting to one of the binding pad according to one of the correspondingly wire, each of the second sensing strips correspondingly connecting to one of the binding pad according to one of the correspondingly wire.

According to another aspect of the disclosure, the disclosure further provides a manufacturing method of the touch display device, comprising providing a substrate; preparing a TFT layer comprising a TFT on the substrate; preparing an anode connecting with a source or a drain of the TFT on the TFT layer; preparing a first touch electrode structure which insulating with the anode on the TFT layer; preparing a first planar layer on the first touch electrode structure, the TFT layer and the anode; preparing a second touch electrode structure on the first planar layer; preparing a first hole for exposing the anode in the first planar layer; preparing an OLED element on the anode; preparing a cathode which insulating with the second touch electrode structure on the first planar layer, the cathode is filled to the first hole for connecting the OLED element; and forming a packaging layer on the cathode and the first planar layer.

According to yet another aspect of the disclosure, the disclosure further provides a manufacturing method of the touch display device, comprising providing a substrate; preparing a TFT layer comprising a TFT on the substrate; preparing an anode connecting with a source or a drain of the TFT on the TFT layer; preparing a first touch electrode structure which insulating with the anode on the TFT layer; preparing a first planar layer on the first touch electrode structure, the TFT layer and the anode; preparing a second touch electrode structure on the first planar layer; preparing an insulating protecting layer on the first planar layer and the second touch electrode; preparing a first hole for exposing the anode in the first planar layer and the insulating protecting layer; preparing an OLED element on the anode; preparing a cathode which on the insulating protecting layer, and the cathode is filled to the first hole for connecting the OLED element; and forming a packaging layer on the cathode and the insulating protecting layer.

In an embodiment, the method further comprising preparing a plurality of binding pad and a plurality of wire on the substrate; wherein, each of the first sensing strips correspondingly connecting to one of the binding pad according to one of the correspondingly wire, each of the second sensing strips correspondingly connecting to one of the binding pad according to one of the correspondingly wire.

In sum, this disclosure is embedding the touch electrode structure in the OLED display device, which is achieves the In-cell touch OLED display device. At the same time, each of the OLED elements has a relatively small distance such that achieves high accuracy touch manufacture of the OLED display device.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
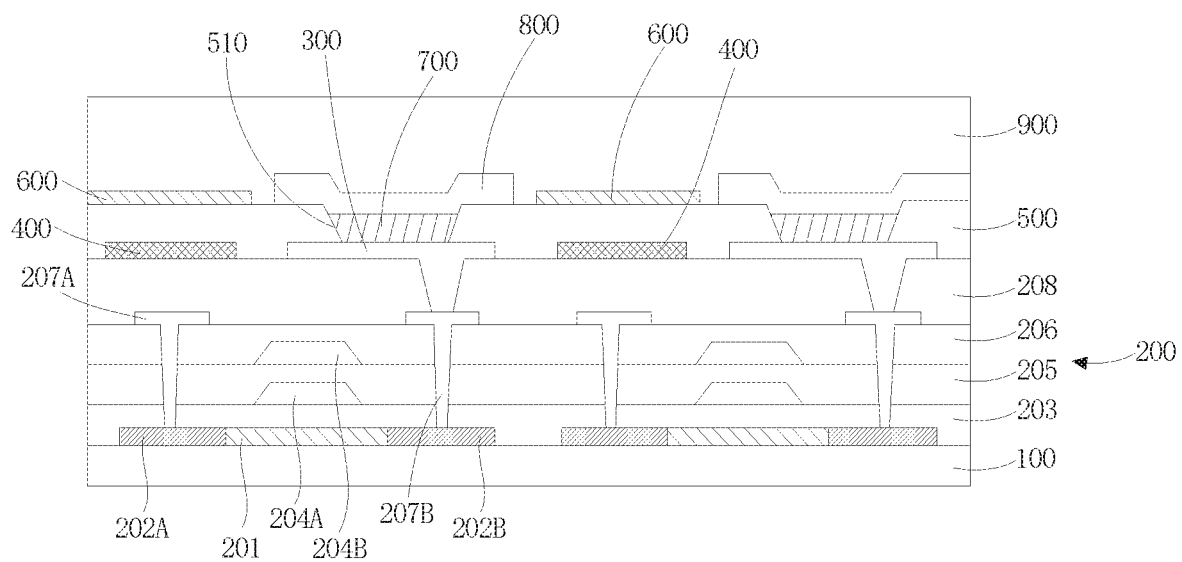
FIG. 1 is a cross sectional schematic view of a touch display device according to an embodiment of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the drawings, the same reference numerals will be used throughout to designate the same of like elements. It will be understood that, although the terms first, second, etc. may be used hereinto describe various elements, these elements should not be limited by these terms. There terms are only used to distinguish one element from another.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

FIG. 1 is a cross sectional schematic view of a touch display device according to an embodiment of the disclosure.

Please refer to the FIG. 1. The touch display device includes a substrate 100, a TFT layer 200, an anode 300, a first touch electrode structure 400, a first planar layer 500, a second touch electrode structure 600, an OLED element 700, a cathode 800 and a packaging layer 900.

The substrate 100 could be glass substrate or resin substrate. The TFT (thin film transistor) layer 200 is positioned on the substrate 100, the TFT layer 200 is composited by a plurality of TFT which is array arrangement. In the FIG. 1, only illustrates two TFT structures. It is noted that, the structure of the other TFT as same as structure of the TFT shows in the FIG. 1.

Specifically, each of the TFTs includes an active layer 201 is positioned on the substrate 100. A source 202A and a drain 202B are respectively positioned beside the active layer 201. A first insulating layer 203 is positioned on the active layer 201, the source 202A and the drain 202B. A first grid 204A is positioned on the first insulating layer 203. A second insulating layer 205 is positioned on the first insulating layer 203 and the first grid 204A. A second grid 204B is positioned on the second insulating layer 205. A third insulating layer 206 is positioned on the second insulating layer 205 and the second grid 204B. A source connecting electrode 207A and a drain connecting electrode 207B are positioned on the third insulating layer 206, the source connecting electrode 207A and the drain connecting electrode 207B are respectively connecting to the source 202A and the drain 202B after pass through the first insulating layer 203, the second insulating layer 205 and the third insulating layer 206. A second planar layer 208 is positioned on the source connecting electrode 207A, the drain connecting electrode 207B and the third insulating layer 206. Here, the source connecting electrode 207A and the drain connecting electrode 207B are respectively as cathode wires of the source 202A and the drain 202B such that the source connecting electrode 207A and the drain connecting electrode 207B could also called source and drain, or respectively belong to part of the source and the drain.

The anode 300 and the first touch electrode structure 400 are positioned at interval on the second planar layer 208, so that the anode 300 and the first touch electrode structure 400 are insulating with each other. In this embodiment, the anode 300 pass through the second planar layer 208 and connecting with the drain connecting electrode 207B, such that achieves to that the anode 300 connecting with the drain 202B. Here is not limited thereto. For example, in another embodiment, the anode 300 could also pass through the second planar layer 208 and connecting with the source connecting electrode 207A, such that achieves to that the anode 300 connecting with the source 202A. In addition, an anode 300 is corresponding to a TFT, therefore if a plurality of TFT are array arrangement, the correspondingly plurality of anode 300 are also array arrangement, please refer to FIG. 2.

The first planer layer 500 is positioned on the first touch electrode structure 400, an anode 300 and the second planer layer 208. The first planer layer 500 has a first hole 501 for exposing the anode 300 (or partial of the anode 300).

The second touch electrode structure 600 is positioned on the first planer layer 500. The OLED element 700 is positioned on the exposed anode 300 (or partial of the anode 300). The cathode 800 is positioned on the first planer layer 500 and positioned at interval and insulating with the second touch electrode structure 600, the cathode 800 is filling the first hole 510 for connecting with the OLED element 700. The packaging layer 900 is positioned on the cathode 800 and the first planar layer 500. In this embodiment, each of the anodes 300 has an OLED element 700 positioned thereon, which is that the OLED elements 700 are array arrangement. However, cathode 800 is strip-shaped, which is extending along in row direction, each of the cathode 800 is located on the OLED element 700 in the same line and connecting with the OLED element 700 in the same line. Please refer to the FIG. 3.

Figure 2:
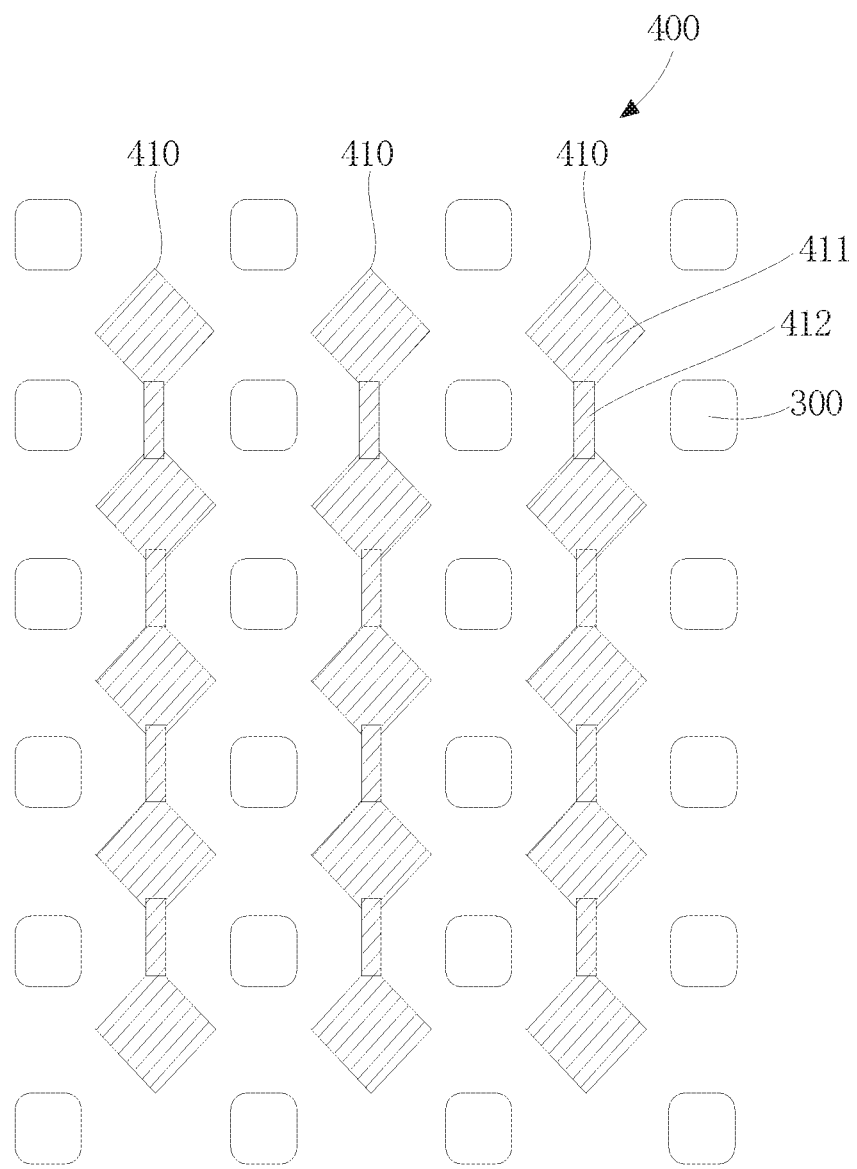
FIG. 2 is an arrangement schematic view of an anode and a first touch electrode structure according to an embodiment of the disclosure.

FIG. 2 is an arrangement schematic view of the anode and the first touch electrode structure according to an embodiment of the disclosure. It should be notice, in the FIG. 3, for convenience shows the space relation of the anode and the first touch electrode structure so that only illustrates these two elements, and omits other elements.

Please refer to FIG. 2. The plurality of the anode 300 is array arrangement. The first touch electrode structure 400 includes a plurality of first sensing strip 410. Each of the sensing strips 410 is extending along a first direction (which is column direction or Y direction), and the sensing strips 410 are parallel to each other and separately positioned. Each of the first sensing strips 410 comprises a plurality of cascade first sensing pad 411 and a plurality of first bridge connector 412. In this embodiment, the first sensing pad 411 is rectangular, but here is not limited thereto, for example the first sensing pad 411 also could be one of grid, rhombus, triangle, regular pentagon, regular hexagon, and octagon.

Further, each of the first sensing strips 410 is positioned between two correspondingly adjust column of the anodes 300, and a space is between the first sensing strips 410 and two correspondingly adjust column of the anodes 300.

Figure 3:
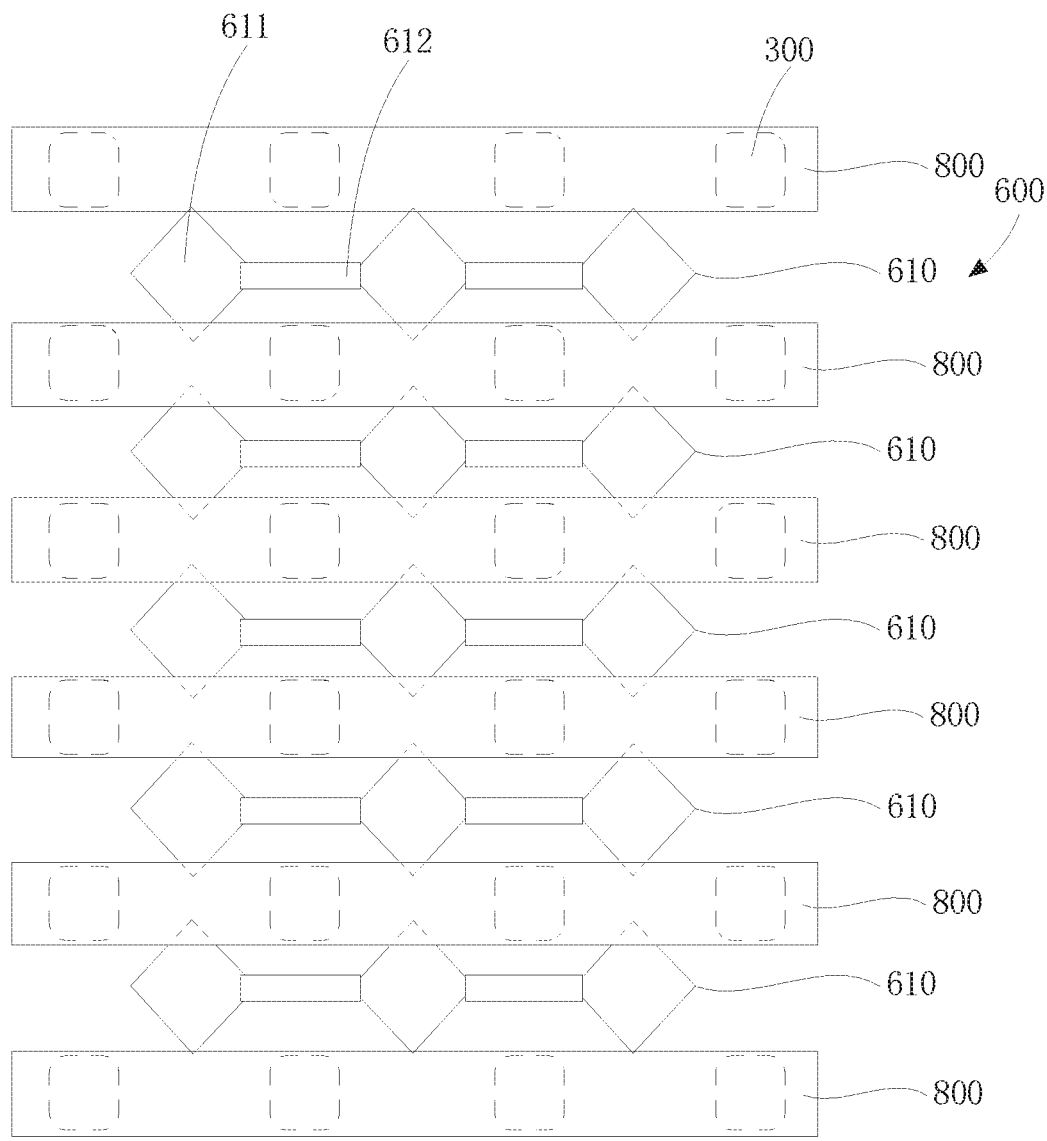
FIG. 3 is an arrangement schematic view of an anode, and cathode and a second touch electrode structure according to an embodiment of the disclosure.

FIG. 3 is an arrangement schematic view of the anode, and the cathode and the second touch electrode structure according to an embodiment of the disclosure. It should be notice, in the FIG. 3, for convenience shows the space relation of the anode, the cathode and the second touch electrode structure so that only illustrates these three elements, and omits other elements.

Please refer to FIG. 3. The plurality of the anodes 300 are array arrangement. The second touch electrode structure 600 includes a plurality of second sensing strip 610. Each of the second sensing strips 610 is extending along a second direction (which is row direction or X direction) which is perpendicular to the first direction, and the second sensing strips 610 are parallel to each other and separately positioned. Each of the second sensing strips 610 comprises a plurality of cascade second sensing pad 611 and a plurality of second bridge connector 612. In this embodiment, the second sensing strips 610 is rectangular, but here is not limited thereto, for example the second sensing strips 610 also could be one of grid, rhombus, triangle, regular pentagon, regular hexagon, and octagon.

Further, each of the second sensing strips 610 is positioned between two correspondingly adjust row of the anodes 300, and a space is between the second sensing strips 610 and two correspondingly adjust row of the anodes 300.

As describes above, cathode 800 is strip-shaped and extending along to row direction. Each of the cathode strips 800 is related to a correspondingly row anode 300, but here is not limited thereto. For example, cathode 800 could has same shape as the anode 300, a plurality of the cathode 800 is array arrangement, and one cathode 800 is related to one correspondingly anode 300.

In addition, while touch operation, the first sensing strip 410 could be an emitting electrode (which is Tx electrode), the second sensing strip 610 could be a receiving electrode (which is Rx electrode). But here is not limited thereto.

Figure 4:
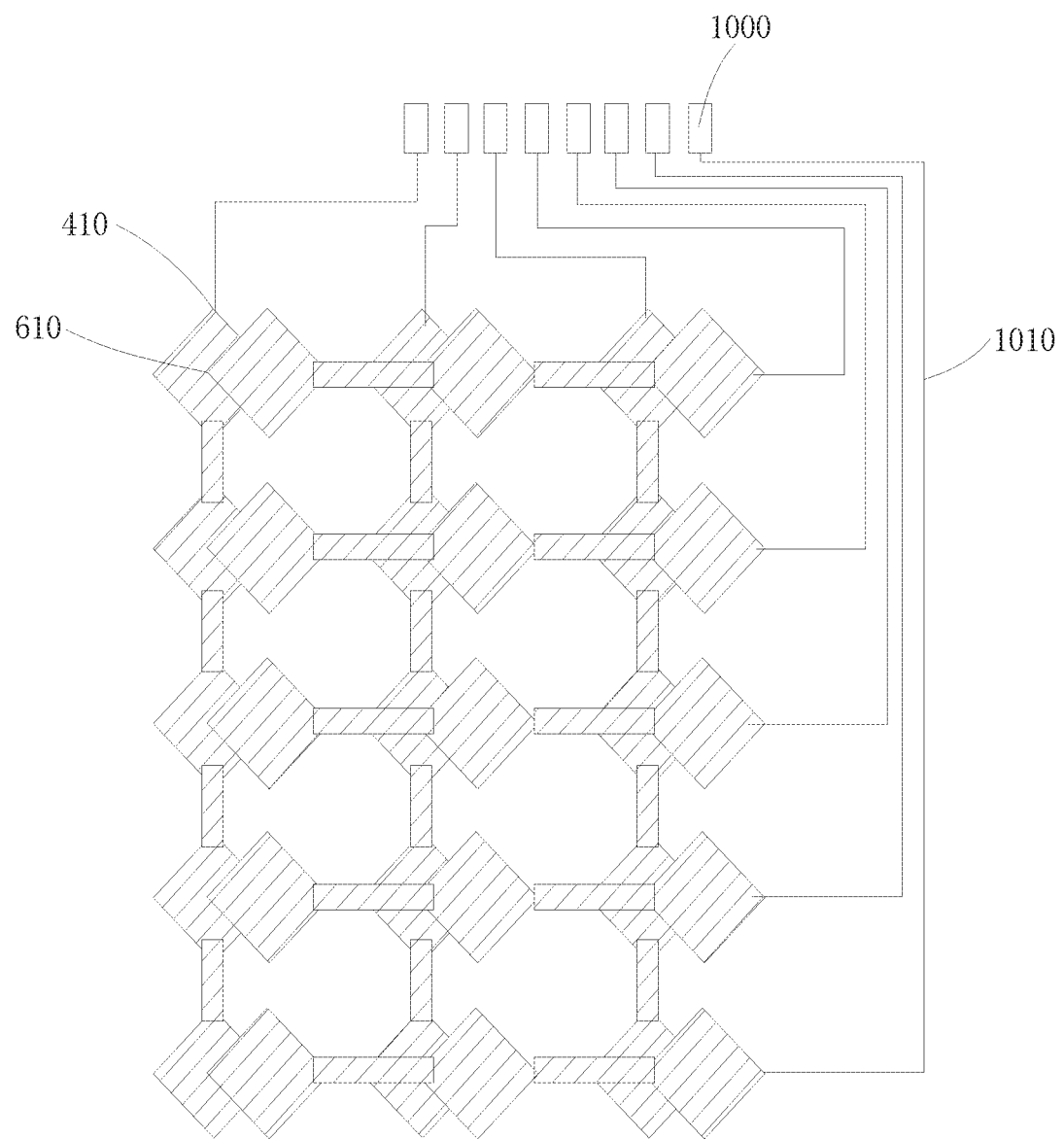
FIG. 4 is a connecting schematic view of a touch electrode structure and a binding pad according to an embodiment of the disclosure.

FIG. 4 is a connecting schematic view of the touch electrode structure and the binding pad according to an embodiment of the disclosure. In the FIG. 4, for convenience shows the position relation of the first touch electrode structure 400 and the second touch electrode structure 600 so that omits other elements. It is noted that, the first touch electrode structure 400 and the second touch electrode structure 600 are insulating to each other.

Please refer to the FIG. 4. In this embodiment of this invention, the touch display device further comprises a plurality of binding pad 1000 and a plurality of wire 1010. Wherein, each of the first sensing strips 410 correspondingly connecting to one of the binding pad 1000 according to one of the correspondingly wire 1010, each of the second sensing strips 610 is correspondingly connecting to one of the binding pad 1000 according to one of the correspondingly wire 1010. It is should be understood, the plurality of the binding pad 1000 and the plurality of wire 1010 are generally formed on the binding region (non-display region) of the substrate 100.

Figure 5:
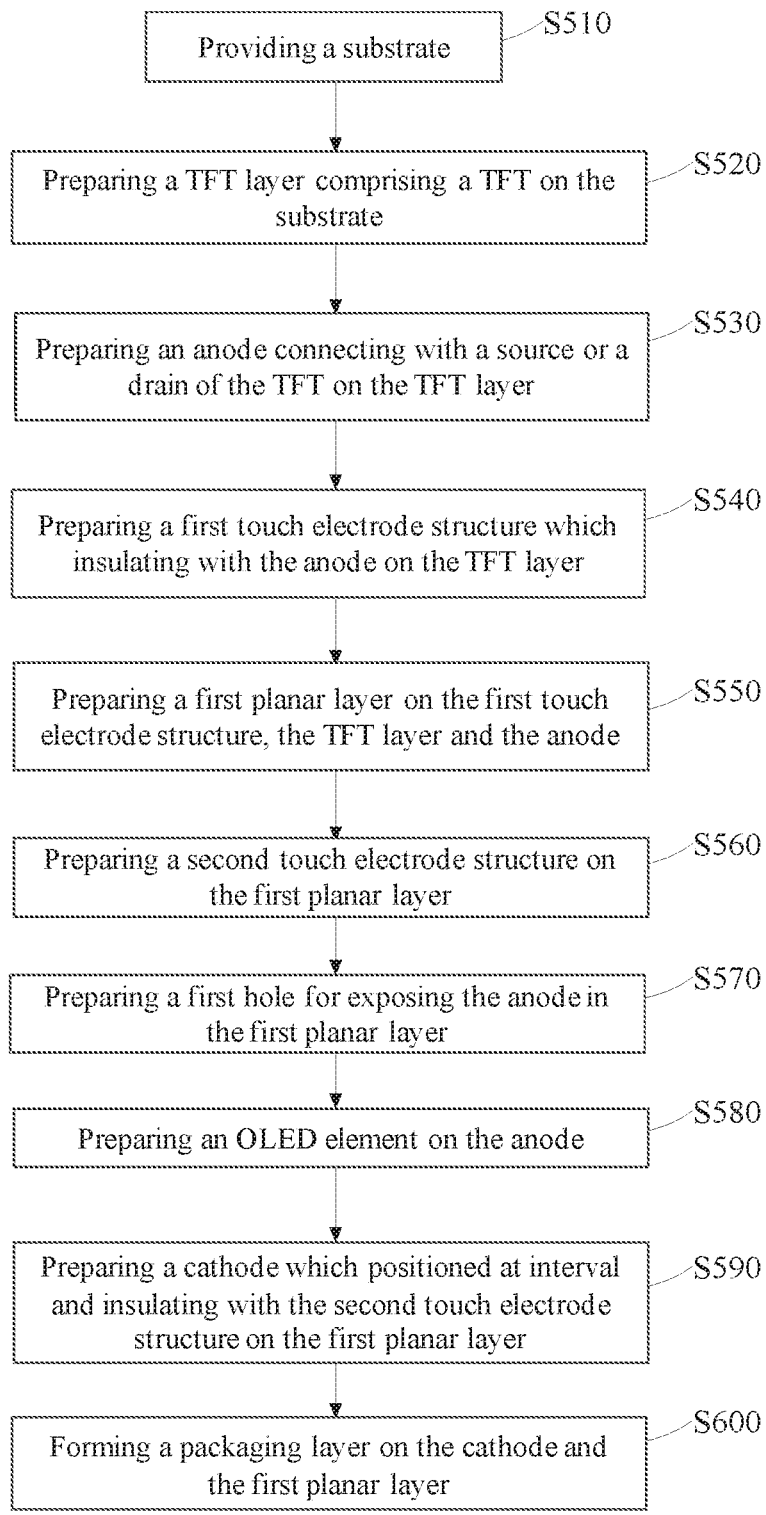
FIG. 5 is a flow chart diagram of a manufacturing method of the touch display device according to an embodiment of the disclosure.

FIG. 5 is a flow chart diagram of a manufacturing method of the touch display device according to an embodiment of the disclosure.

Please refer to FIG. 5. The manufacturing method of the touch display device comprising following steps.

Step S510, providing a substrate 100.

Step S520, preparing a TFT layer 200 comprising a TFT on the substrate 100. The specifically structure of the TFT as the above described.

Step S530, preparing an anode 300 connecting with a source 202A or a drain 202B of the TFT on the TFT layer 200.

Step S540, preparing a first touch electrode structure 400 which positioned at interval and insulating with the anode 300 on the TFT layer 200.

Step S550, preparing a first planar layer 500 on the first touch electrode structure 400, the TFT layer 200 and the anode 300.

Step S560, preparing a second touch electrode structure 600 on the first planar layer 500.

Step S570, preparing a first hole 510 for exposing the anode 300 in the first planar layer 500.

Step S580, preparing an OLED element 700 on the anode 300.

Step S590, preparing a cathode 800 which positioned at interval and insulating with the second touch electrode structure 600 on the first planar layer 500, the cathode 800 is filled to the first hole 510 for connecting the OLED element 700.

Step S600, forming a packaging layer 900 on the cathode 800 and the first planar layer 500.

Further, in another embodiment, the manufacturing method of the touch display device further comprises following steps. Preparing a plurality of binding pad 1000 and a plurality of wire 1010 on the substrate 100; wherein, each of the first sensing strips 410 is correspondingly connecting to one of the binding pad 1000 according to one of the correspondingly wire 1010, each of the second sensing strips 610 is correspondingly connecting to one of the binding pad 1000 according to one of the correspondingly wire 1010.

Figure 6:
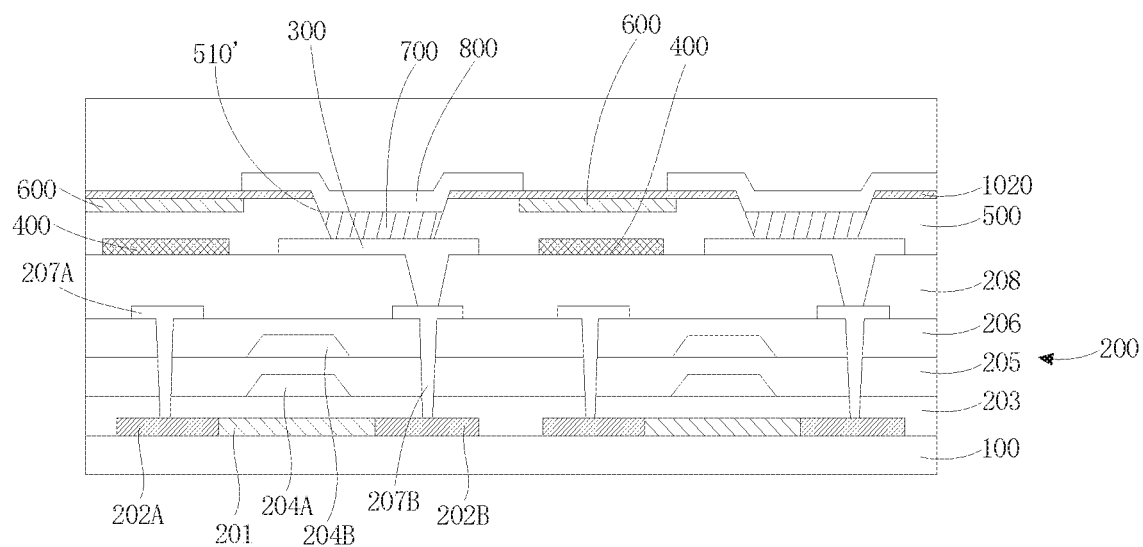
FIG. 6 is a cross sectional schematic view of a touch display device according to another embodiment of the disclosure.

FIG. 6 is a cross sectional schematic view of a touch display device according to another embodiment of the disclosure.

Please refer to FIG. 6, the difference between the touch display device shows as FIG. 1 as following describing. According to another embodiment of the touch display device further comprises an insulating protecting layer 1020 is positioned between the second touch electrode structure 600 and the first planar layer 500. There has a second hole 510' positioned in the insulating protecting layer 1020 and the first planar layer 500 for exposing the anode 300. The cathode 800 is positioned on the insulating protecting layer 1020, and cathode 800 is filled in the second hole 510' for connecting the OLED element 700. Which is that the insulating protecting layer 1020 is positioned between the first planar layer 500 and the cathode 800 and covering the second touch electrode structure 600. Therefore, on one hand it's for protecting the second touch electrode structure 600 and not connecting with the cathode 800, on another hand it's for forming flat surface and convenient manufacturing the cathode 800. The packaging layer 900 is positioned on the cathode 800 and the insulating protecting layer 1020.

Figure 7:
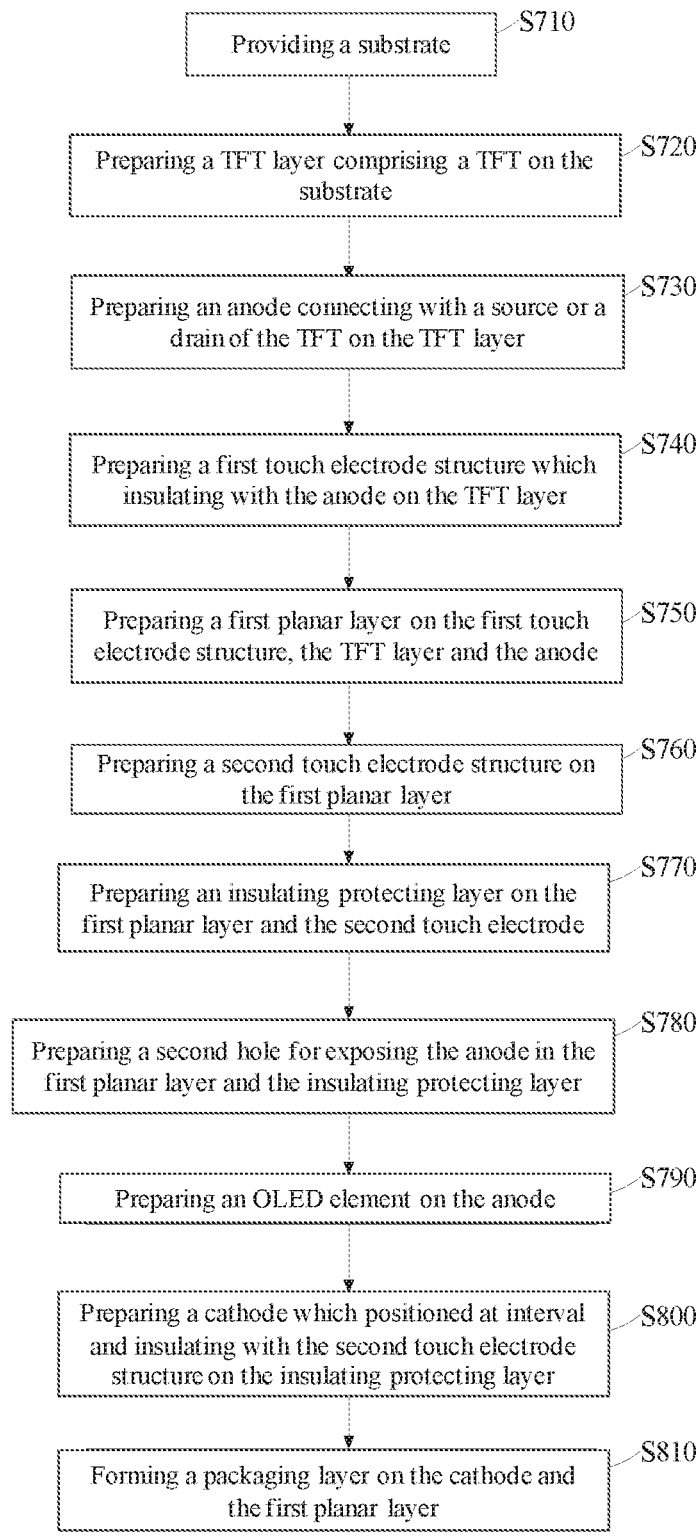
FIG. 7 is a flow chart diagram of a manufacturing method of the touch display device according to another embodiment of the disclosure.

FIG. 7 is a flow chart diagram of a manufacturing method of the touch display device according to another embodiment of the disclosure.

Please refer to FIG. 7. The manufacturing method of the touch display device comprising following steps.

Step S710, providing a substrate 100.

Step S720, preparing a TFT layer 200 comprising a TFT on the substrate 100. The specifically structure of the TFT as the above described.

Step S730, preparing an anode 300 connecting with a source 202A or a drain 202B of the TFT on the TFT layer 200.

Step S740, preparing a first touch electrode structure 400 which positioned at interval and insulating with the anode 300 on the TFT layer 200.

Step S750, preparing a first planar layer 500 on the first touch electrode structure 400, the TFT layer 200 and the anode 300.

Step S760, preparing a first planar layer 500 on the second touch electrode structure 600.

Step S770, preparing an insulating protecting layer 1020 on the first planar layer 500 and the second touch electrode structure 600.

Step S780, forming a second hole 520' in the insulating protecting layer 1020 and the first planar layer 500 for exposing the anode 300.

Step S790, preparing an OLED element 700 on the anode 300.

Step S800, preparing a cathode 800 on the insulating protecting layer 1020, the cathode 800 is filled to the second hole 510' for connecting with the OLED element 700.

Step S810, forming a packaging layer 900 on the cathode 800 and the insulating protecting layer 1020.

In sum, this disclosure is embedding the touch electrode structure in the OLED display device, which is achieves the In-cell touch OLED display device. At the same time, each of the OLED elements has a relatively small distance such that achieves high accuracy touch manufacture of the OLED display device.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A touch display device, comprising
a substrate;
a TFT layer positioned on the substrate, and the TFT layer comprising a TFT;
an anode positioned on the TFT layer and contacting with a source or a drain of the TFT;
a first touch electrode structure positioned on the TFT and insulating with the anode;
a first planar layer positioned on the first touch electrode structure, the TFT and the anode, the first planar layer has a first hole for exposing the anode;
a second touch electrode structure positioned on the first planar layer;
an OLED element positioned on the anode;
a cathode positioned on the first planar layer and insulating with the second touch electrode structure, the cathode is filled the first hole for connecting with the OLED element; and
a packaging layer positioned on the cathode and the first planar layer;
wherein the touch display device further comprises an insulating protecting layer positioned between the first planar layer and the cathode, and covering on top of the second touch electrode structure directly.

2. The touch display device according to claim 1, wherein the first touch electrode structure comprising a plurality of first sensing strip, the first sensing strips are parallel to each other and separately positioned, and each of the first sensing strips is extending along a first direction, each of the first sensing strips comprises a plurality of cascade first sensing pad and a plurality of first bridge connector.

3. The touch display device according to claim 2, wherein the second touch electrode structure comprising a plurality of second sensing strip, the second sensing strips are parallel to each other and separately positioned, and each of the second sensing strips is extending along a second direction which is perpendicular to the first direction, each of the second sensing strips comprises a plurality of cascade second sensing pad and a plurality of second bridge connector.

4. The touch display device according to claim 3, wherein shape of the first sensing pad and/or the second sensing pad is one of rectangular, grid, rhombus, triangle, regular pentagon, regular hexagon, octagon.

5. The touch display device according to claim 3, wherein the touch display device further comprising a plurality of binding pad and a plurality of wire, each of the first sensing strips correspondingly connecting to one of the binding pad according to one of the correspondingly wire, each of the second sensing strips correspondingly connecting to one of the binding pad according to one of the correspondingly wire.

* * * * *